United States Patent
Ono et al.

(10) Patent No.: US 6,756,166 B2
(45) Date of Patent: Jun. 29, 2004

(54) PHOTOSENSITIVE RESIN COMPOSITION AND PRINTED WIRING BOARD

(75) Inventors: Takao Ono, Iruma (JP); Ichiro Miura, Iruma (JP)

(73) Assignee: Tamurakaken Corporation (JP)

( * ) Notice: Subject to any disclaimer, the term of this patent is extended or adjusted under 35 U.S.C. 154(b) by 24 days.

(21) Appl. No.: 10/252,200

(22) Filed: Sep. 23, 2002

(65) Prior Publication Data

US 2003/0068567 A1 Apr. 10, 2003

(30) Foreign Application Priority Data

Sep. 25, 2001 (JP) .................................... 2001-291324

(51) Int. Cl.$^7$ .............................................. G03F 7/038
(52) U.S. Cl. .................. 430/18; 430/280.1; 430/285.1; 430/288.1; 430/311; 430/286.1; 430/287.1; 430/14; 522/100; 522/103; 522/9; 522/10; 522/14; 522/26
(58) Field of Search .......................... 430/280.1, 285.1, 430/288.1, 311, 18; 522/100, 103, 9, 10, 14, 26

(56) References Cited

U.S. PATENT DOCUMENTS

| | | | | |
|---|---|---|---|---|
| 3,980,483 A | * | 9/1976 | Nishikubo et al. | 430/286.1 |
| 4,025,348 A | * | 5/1977 | Tsukada et al. | 430/280.1 |
| 5,009,982 A | * | 4/1991 | Kamayachi et al. | 430/280.1 |
| 5,100,767 A | * | 3/1992 | Yanagawa et al. | 430/280.1 |
| 5,604,080 A | * | 2/1997 | Suzuki et al. | 430/280.1 |
| 5,620,831 A | * | 4/1997 | Kawana | 430/280.1 |
| 2003/0087189 A1 | * | 5/2003 | Takagi et al. | 430/280.1 |

FOREIGN PATENT DOCUMENTS

| | | | |
|---|---|---|---|
| GB | 1449326 | * | 9/1976 |
| JP | 50-144431 | | 11/1975 |
| JP | 51-40451 | | 11/1976 |
| JP | 56-40329 | | 9/1981 |
| JP | 57-45785 | | 9/1982 |
| JP | 01-54390 | | 11/1989 |
| JP | 02-173747 | | 5/1990 |
| JP | 3134037 | | 6/1991 |

* cited by examiner

Primary Examiner—Cynthia Hamilton
(74) Attorney, Agent, or Firm—McKee, Voorhees & Sease, P.L.C.

(57) ABSTRACT

Disclosed is a photosensitive resin composition which can be developed using a dilute aqueous alkaline solution after ultraviolet ray exposure, is excellent in pot life, capable of preventing deposits from being generated in a cured coated film, capable of widening heat control tolerance, and is excellent in sensitivity, in heat resistance, in chemical resistance and in electric insulating properties, thereby rendering the composition suitable for use as a solder resist for producing a printed wiring board. This photosensitive resin composition comprises (A) an active energy ray-curable resin having at least two ethylenic unsaturated linkages per molecule thereof, (B) at least one kind material selected from acid salts of N-substituted melamine compound and acid salts of guanamine compound, (C) a photopolymerization initiator, (D) a diluent, and (E) a thermosetting compound. There is also disclosed a printed wiring board where this photosensitive resin composition is employed.

22 Claims, No Drawings

PHOTOSENSITIVE RESIN COMPOSITION AND PRINTED WIRING BOARD

This application claims priority to Japanese Patent application No. 2001-291324, filed Sep. 25, 2001.

TECHNICAL FIELD

This invention relates to a photosensitive resin composition which is useful in forming an image by a process comprising a step of ultraviolet ray exposure and a step of development using a dilute aqueous alkaline solution, is capable of prolonging pot life, of preventing deposits from being generated in a cured coated film, of widening so-called heat control tolerance (i.e. the controllable range of thermal tolerance relative to the degree of curing of coated film that can be removed on the occasion of developing the unexposure regions at the step of drying the coated film), and is excellent in sensitivity, in heat resistance, in chemical resistance and in electric insulating properties, thereby rendering the photosensitive resin composition suitable for use as a solder resist for producing a printed wiring board.

This invention also relates to a printed wiring board formed by making use of such photosensitive resin composition as mentioned above.

BACKGROUND OF THE INVENTION

The printed wiring board is employed for mounting electronic components on soldering lands of a conductive circuit pattern which has been formed in advance on the substrate of the printed wiring board, wherein all of the circuit regions excluding the soldering lands are covered by a solder resist film as a permanent protective film. By this covering of solder resist film, it becomes possible to prevent the solder from adhering onto regions which are not required to be coated with the solder on the occasion of soldering electronic components to the printed wiring board, and to prevent the conductor constituting the circuit pattern from being directly exposed to air and hence from being oxidized or corroded by moisture.

Conventionally, the solder resist film is formed, in most cases, by a process wherein a liquid composition of the solder resist film is coated on a substrate by means of a screen printing to form a pattern, which is then dried to remove a solvent and cured by means of ultraviolet rays or heating.

Recently however, due to the increasing demands for the enhancement in density (fineness) of wirings of the printed wiring board, a solder resist composition (referred hereinafter also as a solder resist ink composition) is also required to be more excellent in resolution as well as in precision. Under such circumstances, there has been proposed, in place of the conventional screen printing method and irrespective of the kinds of substrate i.e. consumer's use or industrial use, a liquid photosolder resist method (photodeveloping method) which is excellent in registration precision and in covering property of the edge portions of conductive body. For example, Japanese Patent Unexamined Publication S50-144431 and Japanese Patent Publication S51-40451 disclose solder resist compositions comprising bisphenol type epoxy acrylate, a sensitizer, an epoxy compound and an epoxy curing agent. These solder resist compositions are designed to be employed in such a manner that a liquid photosensitive composition is coated all over a printed wiring board, and after the solvent included therein is permitted to volatilize, the layer of the photosensitive composition is selectively exposed to irradiation, unexposed regions of the layer being subsequently removed by making use of an organic solvent to thereby perform the development of the solder resist.

However, the removal of the unexposure regions (development) by making use of an organic solvent necessitates a large quantity of the organic solvent, hence giving rise to environmental contamination or the generation of fire. Particularly, since the influence of the environmental contamination upon human body is high-lighted recently, there have been proposed various countermeasures for solving such problems.

With a view to solve these problems, there has been proposed an alkali-development type photosolder resist composition which can be developed by making use of a dilute aqueous alkaline solution. For example, Japanese Patent Publications S56-40329 and S57-45785 disclose a material comprising, as a base polymer, a reaction product which can be obtained by a process wherein an epoxy resin is reacted with unsaturated monocarboxylic acid to obtain a compound to which a poly-basic acid anhydride is added to obtain the reaction product. Further, Japanese Patent Publication H1-54390 discloses a photo-curable liquid resist ink composition which can be developed by making use of a dilute aqueous alkaline solution, this photo-curable liquid resist ink composition comprising an active energy beam-curable resin which can be obtained from a reaction between a saturated or unsaturated poly-basic-acid anhydride and a reaction product obtained from a reaction between a novolac epoxy resin and an unsaturated monocarboxylic acid, and a photopolymerization initiator.

These liquid solder resist compositions are featured in that carboxylic group is introduced into epoxy acrylate to thereby provide them with photosensitivity and capability of being developed using a dilute aqueous alkali solution. These liquid solder resist compositions are further featured in that they usually include a thermosetting component, e.g. an epoxy resin in general, for thermosetting a coated film of these resist compositions after this coated film is formed into a resist pattern by way of exposure and development, thereby allowing a reaction to take place between the carboxylic group introduced into a side chain of the epoxy acrylate and the epoxy group. As a result, it is possible to form a resist film which is excellent in adhesion, hardness, heat resistance and electric insulating properties. In this case, an epoxy resin-curing agent or a curing promotor is generally employed together with the epoxy resin.

As for the epoxy resin-curing promoter, there are conventionally known various kinds of compounds including melamine.

However, when melamine is incorporated together with epoxy resin into the aforementioned alkali-developing type liquid solder resist composition, defective curing may be caused to occur in the resultant coated film due to the poor compatibility of melamine with epoxy resin, and moreover, the resultant composition would be accompanied with a problem that the pot life thereof is relatively short so that it is impossible to secure the storage stability for a long period of time. Further, if melamine is left unreacted in the cured coated film and left to stand under high temperature and high humidity conditions, the melamine is more likely to be separated on the surface of the cured coated film, thereby not only badly affecting the external appearance of the cured film, but also permitting free moisture to penetrating into a melamine-missing portion to thereby deteriorate the electric insulation of the cured coated film. Moreover, since this deposit is also poor in insulation resistance, the electric insulating properties inherent to the cured coated film is more likely to be obstructed.

Japanese Patent No. 3134037 discloses almost the same photosensitive resin composition as mentioned above except that an organic acid salt of melamine is substituted for melamine. This patent publication also describes that "since the melamine salt according to the present invention has a decomposition temperature ranging from about 120 to 150° C., it cannot be decomposed at a provisional drying temperature, - - - but may be decomposed into melamine and an organic acid on the occasion of thermally curing the coated film by heating it at a temperature ranging from about 140 to 180° C., this melamine thus produced - - - ". Namely, melamine is caused to generate in the cured coated film to be ultimately obtained, thus making it unavoidable that free melamine is caused to remain in the coated film. Therefore, the photosensitive resin composition disclosed in this Japanese Patent is also incapable of avoiding the aforementioned problem resulting from the deposition of melamine.

With a view to avoid the problem resulting from the deposition of melamine, the present inventors have proposed, as disclosed in Japanese Patent Unexamined Publication H2-173747, a photosensitive resin composition which comprises (a) an active energy ray (line)-curable resin having at least two ethylenic unsaturated linkages per molecule thereof, (b) an N-substituted melamine derivative or alkyl guanamines, (c) a photopolymerization initiator, (d) a diluent, and (e) a thermosetting compound. This photosensitive resin composition is useful in forming an image by a process comprising a step of ultraviolet ray exposure and a step of development using a dilute aqueous alkaline solution, is capable of prolonging pot life, is excellent in storage stability, is advantageous in that it has so-called latent type curing promoting property, i.e. although it is stable at around the ordinary temperatures, it can be cured rapidly at a higher temperature. Additionally, this photosensitive resin composition is also excellent in heat resistance, in chemical resistance, in moisture resistance, in electric insulating properties, in chemical resistance, and in flexibility, thereby rendering the photosensitive resin composition suitable for use as a solder resist for producing a printed wiring board.

According to the photosensitive resin composition set forth in Japanese Patent Unexamined Publication H2-173747, since the affinity between the N-substituted melamine derivative or alkyl guanamines and the resin of the aforementioned component (a) is enhanced, the N-substituted melamine derivative or alkyl guanamines can be prevented from being separated from the cured coated film, thus making it possible to improve the features thereof in this respect. However, since the compatibility of the N-substituted melamine derivative or alkyl guanamines with respect to the aforementioned component (a) is relatively high as compared with the compatibility between melamine and the aforementioned component (a), there will be raised the problem that the storage stability of the composition is further deteriorated.

Therefore, it is now desired, in order to make good use of a product without deteriorating the performance of the product and hence to save the manufacturing cost thereof, to develop a photosensitive composition which is capable of prolonging the pot life thereof and improving the storage stability thereof. It is also desired to develop a photosensitive composition which is capable of widening so-called heat control tolerance of a printed wiring board (i.e. the controllable range of thermal tolerance relative to the degree of curing of coated film that can be removed on the occasion of developing the unexposure regions at the step of drying the coated film), and is excellent in thermal stability, as well as in other performances of coated film such as sensitivity, heat resistance, electric insulating properties and chemical resistance.

Therefore, a first object of the present invention is to provide a photosensitive resin composition which is capable of prolonging the pot life thereof, is excellent in storage stability, and is capable of preventing deposits from being generated in the cured coated film of the photosensitive resin composition.

A second object of the present invention is to provide a photosensitive resin composition which is useful in forming an image by a process comprising a step of ultraviolet ray exposure and a step of development using a dilute aqueous alkaline solution, is wide in heat control tolerance, and is capable of providing a pattern excellent in sensitivity, heat resistance, adhesion, electric insulating property and chemical resistance.

A third object of the present invention is to provide a printed wiring board with or without an electronic component being mounted thereon, the printed wiring board being provided with a cured solder resist film constituted by the aforementioned photosensitive resin composition.

BRIEF SUMMARY OF THE INVENTION

The present inventors have found, as a result of intensive studies for achieving the aforementioned objects, that the employment of at least one kind material selected from organic acid salts of N-substituted melamine compound and organic acid salts of guanamine compound as a curing promoter for epoxy resin is effective in prolonging the pot life of the photosensitive resin composition, in improving the storage stability thereof, in widening the heat control tolerance, and in improving the sensitivity, heat resistance, adhesion, electric insulating property and chemical resistance, thereby rendering the photosensitive resin composition suitable for use as a solder resist for producing a printed wiring board.

Namely, according to the present invention, there is provided (1) a photosensitive resin composition comprising (A) an active energy ray (line)-curable resin having at least two ethylenic unsaturated linkages per molecule thereof, (B) at least one kind material selected from acid salts of N-substituted melamine compound and acid salts of guanamine compound, (C) a photopolymerization initiator, (D) a diluent, and (E) a thermosetting compound.

According to the present invention, there is also provided (2) the photosensitive resin composition as set forth in the aforementioned item (1), wherein said acid salts of N-substituted melamine compound are organic acid salts of N-substituted melamine compound represented by the following general formula (1) and said acid salts of guanamine compound are organic acid salts of guanamine compound represented by the following general formula (2).

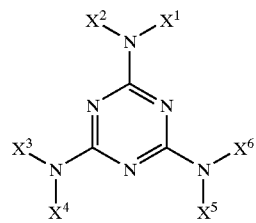

Formula (1)

wherein $X^1$, $X^2$, $X^3$, $X^4$, $X^5$ and $X^6$ may be the same or different and are individually hydrogen atom, an alkyl group (including a substituted alkyl group) or an aromatic group (including a substituted aromatic group) with the proviso that all of Xs are not hydrogen atom.

Formula (2)

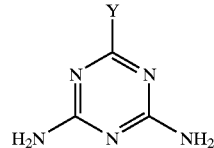

wherein Y is an alkyl group or an aromatic group (including a substituted aromatic group).

According to the present invention, there is also provided (3) the photosensitive resin composition as set forth in the aforementioned item (2), wherein said organic acid is at least one kind of compounds represented by the following general formulas (3), (4) and (5).

Formula (3)

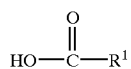

wherein $R^1$ is hydrogen atom, an alkyl group, an alkenyl group or an aromatic group.

Formula (4)

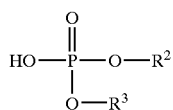

wherein $R^2$ and $R^3$ may be the same or different and are individually hydrogen atom, an alkyl group, an alkenyl group or an aromatic group.

Formula (5)

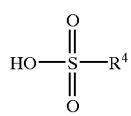

wherein $R^4$ is hydrogen atom, an alkyl group, an alkenyl group or an aromatic group.

According to the present invention, there is also provided (4) the photosensitive resin composition as set forth in any one of the aforementioned items (1) to (3), wherein the mixing ratio of said at least one kind material selected from acid salts of N-substituted melamine compound and acid salts of guanamine compound (B) is 0.1 to 5 g per 100 g of said active energy ray-curable resin having at least two ethylenic unsaturated linkages per molecule thereof (A).

According to the present invention, there is also provided (5) the photosensitive resin composition as set forth in any one of the aforementioned items (1) to (4), wherein the mixing ratio of said photopolymerization initiator (C) is 0.2 to 30 g per 100 g of said active energy ray-curable resin having at least two ethylenic unsaturated linkages per molecule thereof (A).

According to the present invention, there is also provided (6) the photosensitive resin composition as set forth in any one of the aforementioned items (1) to (5), wherein said diluent (D) is at least one kind of material selected from photopolymerizable monomer and an organic solvent, which is employed at a ratio of 2 to 40 g based on 100 g of said active energy ray-curable resin having at least two ethylenic unsaturated linkages per molecule thereof (A).

According to the present invention, there is also provided (7) the photosensitive resin composition as set forth in any one of the aforementioned items (1) to (6), wherein said thermosetting compound (E) is constituted by an epoxy compound with or without other kind(s) of thermosetting compound(s) and is employed at a ratio of 5 to 100 g based on 100 g of said active energy ray-curable resin having at least two ethylenic unsaturated linkages per molecule thereof (A).

According to the present invention, there is also provided (8) a printed wiring board with or without an electronic component being mounted thereon, the printed wiring board being covered with a solder resist film constituted by a cured film of the aforementioned photosensitive resin composition as set forth in any one of the aforementioned items (1) to (7).

According to the present invention, there is also provided (9) a thermosetting resin composition comprising (B) at least one kind material selected from acid salts of N-substituted melamine compound and acid salts of guanamine compound, (D) a diluent, and (E) a thermosetting compound.

This thermosetting resin composition may be limited by any one of the aforementioned items (2) to (8).

DETAILED DESCRIPTION OF THE INVENTION

As for "(A) an active energy ray curable resin having at least two ethylenic unsaturated linkages in one molecule" according to the present invention, it is possible to employ those which can be obtained by a process wherein at least part of epoxy group of multifunctional epoxy resin having at least two ethylenic unsaturated linkages per molecule thereof is allowed to react with a radically polymerizable unsaturated monocarboxylic acid such as acrylic acid or methacrylic acid to produce a compound having hydroxyl group with which a polybasic acid or a polybasic acid anhydride is reacted to obtain said active energy line curable resin.

As for the aforementioned multifunctional epoxy resin, it is possible to employ any kinds of epoxy resin as long as it is at least bifunctional, and there is not any particular limitation with regard to the epoxy equivalent thereof, which may be generally 1,000 or less, more preferably 100 to 500.

For example, it is possible to employ phenol novolac type epoxy resins such as bisphenol A, bisphenol F and bisphenol AD; cresol novolac type epoxy resins such as-o-cresol novolac type epoxy resins; bisphenol A novolac type epoxy resins; cyclic aliphatic multifunctional epoxy resin; glycidyl ester type multifunctional epoxy resin; glycidyl amine type multifunctional epoxy resin; heterocyclic multifunctional epoxy resin; bisphenol modified novolac type epoxy resins; multifunctional modified novolac type epoxy resins; and condensed type epoxy resin formed between phenols and aromatic aldehyde having a phenolic hydroxyl group. It is also possible to employ those where a halogen atom such as Br, Cl, etc. is introduced into these resins mentioned above. Among them, novolac type epoxy resins are preferable in terms of heat resistance. These epoxy resins may be employed singly or in combination of two or more kinds thereof.

When these epoxy resins are then reacted with a radically polymerizable unsaturated monocarboxylic acid, epoxy group is cleaved through the reaction between epoxy group and carboxylic group to thereby generate hydroxyl group and ester linkage. As for the radically polymerizable unsaturated monocarboxylic acid useful in this case, there is not any particular limitation. For example, it is possible to employ acrylic acid, methacrylic acid, crotonic acid, cinnamic acid, etc. However, it is preferable to employ at least either acrylic acid or methacrylic acid (which may be hereinafter referred to as (metha) acrylic acid), acrylic acid being most preferable. There is not any particular limitation regarding the reacting method between the epoxy resin and the radically polymerizable unsaturated monocarboxylic acid. For example, these epoxy resin and acrylic acid can be reacted by heating them in a suitable diluent. As for the diluent, it is possible to employ ketones such as methylethyl ketone, cyclohexanone, etc.; aromatic hydrocarbons such as toluene, xylene, etc.; alcohols such as methanol, isopropanol, cyclohexanol, etc.; alicyclic hydrocarbons such as cyclohexane, methylcyclohexane, etc.; petroleum solvents such as petroleum ether, petroleum naphtha, etc.; Cellosolves such as Cellosolve, butyl Cellosolve, etc.; carbitols such as carbitol, butyl carbitol, etc.; and acetic esters such as ethyl acetate, butyl acetate, Cellosolve acetate, butyl Cellosolve acetate, carbitol acetate, butylcarbitol acetate, etc. As for the catalyst to be employed in this case, it is possible to employ amines such as triethyl amine, tributyl amine, etc.; and phosphides such as triphenyl phosphine, triphenyl phosphate, etc.

In the reaction between the aforementioned epoxy compounds and the radically polymerizable unsaturated monocarboxylic acid, it is preferable that the radically polymerizable unsaturated monocarboxylic acid should preferably be employed at a ratio of 0.7 to 1.2 equivalent weight per equivalent weight of epoxy group contained in the epoxy compounds. If at least either acrylic acid or methacrylic acid is to be employed for the reaction, it should preferably be employed at a ratio of 0.8 to 1.0 equivalent weight per equivalent weight of epoxy group contained in the epoxy compounds. If the ratio of the radically polymerizable unsaturated monocarboxylic acid is less than 0.7 equivalent weight, the gellation may be caused to occur on the occasion of a subsequent step of synthesizing reaction, or otherwise the stability of the resin may be deteriorated. On the other hand, if the ratio of the radically polymerizable unsaturated monocarboxylic acid is excessive, a lot of unreacted carboxylic acid may be caused to remain, so that the various properties of cured matter (for example, water proofness) may be caused to deteriorate. The reaction between these epoxy resins and the radically polymerizable unsaturated monocarboxylic acid should preferably be performed under a heated condition, wherein the reaction temperature should preferably be within the range of 80 to 140° C. If the reaction temperature is higher than 140° C., the thermal polymerization of the radically polymerizable unsaturated monocarboxylic acid may be easily caused to take place, thereby making it difficult to perform the synthesizing reaction. If the reaction temperature is lower than 80° C., the reaction rate may become too slow, thereby making it undesirable in a practical manufacturing viewpoint.

In the reaction between the aforementioned epoxy compounds and the radically polymerizable unsaturated monocarboxylic acid in a diluent, the content of the diluent should preferably be confined within the range of 20 to 50% based on the entire weight of the reaction system. In this case, the reaction mixture can be presented, as a solution in the diluent, i.e. without necessitating the isolation of the reaction product between the aforementioned epoxy compounds and the radically polymerizable unsaturated monocarboxylic acid, to the next step where the reaction product is reacted with a polybasic acid.

An unsaturated monocarboxylic acid-modified epoxy compound which is a reaction product between the aforementioned epoxy compounds and the radically polymerizable unsaturated monocarboxylic acid is then allowed to react with a polybasic acid or the anhydride thereof. As for the polybasic acid or the anhydride thereof, there is not any particular limitation, and therefore, it may be a saturated or unsaturated polybasic acid or anhydride thereof. As for the polybasic acid useful in this case, it is possible to employ succinic acid, maleic acid, adipic acid, citric acid, phthalic acid, tetrahydrophthalic acid, 3-methyltetrahydrophthalic acid, 4-methyltetrahydrophthalic acid, 3-ethyltetrahydrophthalic acid, 4-ethyltetrahydrophthalic acid, hexahydrophthalic acid, 3-methylhexahydrophthalic acid, 4-methylhexahydrophthalic acid, 3-ethylhexahydrophthalic acid, 4-ethylhexahydrophthalic acid, methyltetrahydrophthalic acid, methylhexahydrophthalic acid, endomethylenetetrahydrophthalic acid, methylendomethylenetetrahydrophthalic acid, trimellitic acid, pyromellitic acid, and diglycolic acid. As for the polybasic acid anhydride, it is possible to employ anhydrides of these polybasic acids. These compounds can be employed singly or in combination of two kinds thereof.

The polybasic acid or the anhydride thereof is then allowed to react with the hydroxyl group that has been generated from the reaction between the aforementioned epoxy compounds and the radically polymerizable unsaturated monocarboxylic acid, thereby providing the resin with free carboxyl group. The quantity to be employed of the polybasic acid or anhydrides thereof for the reaction should preferably be confined within the range of 0.2 to 1.0 moles per mole of the hydroxyl group attached to the reaction product obtained through the reaction between the aforementioned epoxy compounds and the radically polymerizable unsaturated monocarboxylic acid. It is more preferable, in view of enabling a resin film to obtain a high sensitivity on the occasion of exposure, to perform the reaction by confining the ratio of the polybasic acid or anhydrides thereof to 0.3 to 0.9 mole, more preferably 0.4 to 0.8 mole per mole of the hydroxyl group. If the ratio of the polybasic acid or anhydrides thereof is less than 0.2 mole, the dilute alkali developing property of the resin to be ultimately obtained would be deteriorated. On the other hand, if the ratio of the polybasic acid or anhydrides thereof exceeds over 1.0 moles, various properties (for example, waterproofness) of the cured coated film to be ultimately obtained would be deteriorated.

The polybasic acid is added to the aforementioned unsaturated monocarboxylic acid-modified epoxy resin so as to allow a dehydrocondensation reaction to take place. The water that has been generated in this reaction should preferably be continuously taken out of the reaction system. It is preferable that this reaction is performed under a heated condition at a temperature of 70–130%. If the reaction temperature is higher than 130° C., the thermal polymerization of the radically polymerizable unsaturated groups that have been bonded to the epoxy resin or that can be derived from unreacted monomer may be easily caused to take place, thereby making it difficult to perform the synthesis. On the other hand, if this reaction temperature is lower than 70° C., the speed of reaction would become too slow and therefore is not preferable in view of the actual manufacturing process. These reaction conditions mentioned above are also applicable when an anhydride of the polybasic acid is to be employed.

The acid value of the polybasic acid-modified unsaturated monocarboxylic acid-modified epoxy resin to be produced through the reaction between the aforementioned polybasic acid or anhydride thereof and the unsaturated monocarboxylic acid-modified epoxy resin should preferably be within the range of 60 to 300 mgKOH/g. The acid value of the reaction product can be adjusted by adjusting the quantity of the polybasic acid or anhydride thereof to be used in the reaction.

Although the aforementioned polybasic acid-modified unsaturated monocarboxylic acid-modified epoxy resin can be also employed as a photosensitive resin, a radically polymerizable unsaturated group may be further introduced into this epoxy resin through a reaction between the carboxyl group of this polybasic acid-modified unsaturated monocarboxylic acid-modified epoxy resin and a glycidyl compound having at least one radically polymerizable unsaturated group and epoxy group, thereby obtaining a photosensitive resin which is further improved in photosensitivity.

Since this photosensitive resin which is further improved in photosensitivity is featured in that the radically polymerizable unsaturated group is bonded to the side chain of the polymeric skeleton of the photosensitive resin constituting the precursor thereof due to the last reaction thereof with the glycidyl compound, the photopolymerization reactivity thereof is further enhanced, thus exhibiting excellent photosensitive properties. As for the glycidyl compound having at least one radically polymerizable unsaturated group and epoxy group, it is possible to employ glycidyl acrylate, glycidyl methacrylate, allyl glycidyl ether, pentaerythritol triacrylate monoglycidyl ether, etc. By the way, the molecule of these compounds may contain a plurality of glycidyl groups. These compounds may be employed singly or in combination of two or more kinds thereof.

These glycidyl compounds can be mixed into a solution of the polybasic acid-modified unsaturated monocarboxylic acid-modified epoxy resin so as to allow the reaction thereof to take place. In this case, the reaction is executed by incorporating the glycidyl compound to the solution generally at a ratio of 0.05–0.5 mole per mole of the carboxyl group that has been introduced into the epoxy resin. In view of various factors such as the photosensitivity (sensitivity) of the photosensitive resin composition containing a photosensitive resin that can be obtained, the aforementioned heat control tolerance, and the electric properties such as electric insulation, it would be more advantageous to execute the reaction by incorporating the glycidyl compound at a ratio of 0.1–0.5 mole per mole of the carboxyl group. The reaction temperature in this case should preferably be within the range of 80–120° C. The acid value of the photosensitive resin which is composed of this glycidyl compound-added polybasic acid-modified unsaturated monocarboxylic acid-modified epoxy resin should preferably be within the range of 45–250 mgKOH/g.

As for "(B) at least one kind material selected from acid salts of N-substituted melamine compound and acid salts of guanamine compound" according to the present invention, it should preferably be such that the acid salts of N-substituted melamine compound are organic acid salts of N-substituted melamine compound represented by the aforementioned general formula (1), and the acid salts of guanamine compound are organic acid salts of guanamine compound represented by the aforementioned general formula (2). The $X^1$, $X^2$, $X^3$, $X^4$, $X^5$ and $X^6$ in the aforementioned general formula (1) may be individually hydrogen atom, an alkyl group (including a substituted alkyl group) or an aromatic group (including a substituted aromatic group), and all of these groups may be entirely or partially the same or different from each other, i.e. all of these groups may be the same or may differ from each other, or some of them are the same or different from the others. If all of $X^1$, $X^2$, $X^3$, $X^4$, $X^5$ and $X^6$ are constituted by hydrogen atom, it will become an organic acid salt of melamine and therefore, will be excluded from the scope of the present invention. However, up to five of $X^1$, $X^2$, $X^3$, $X^4$, $X^5$ and $X^6$ may be constituted by hydrogen atom.

As for the alkyl group, straight-chain or branched alkyl groups having 1 to 12 carbon atoms may be generally employed. Specific examples of such alkyl groups include lower alkyl groups such as methyl, ethyl, n-proply, isopropyl and n-butyle; n-hexyl; n-octyl; n-dodecyl; etc. The alkyl group may be a substituted alkyl group having a substituent group. For example, it is possible to employ alkyl groups having, as a substituent group, hydroxyl group, ether group (alkoxyl group), etc. Specific examples of the substituted alkyl group include methylol, methoxy, buthoxy, etc. As for the aromatic group, it is possible to employ aryl group and aralkyl group. Specific examples of the aromatic group include phenyl, benzyl, phenethyl, 3-phenylpropyl and 4-phenylbutyl. The aromatic group may be substituted aromatic group having a substituent group, specific examples of which include lower alkyl groups having 1 to 3 carbon atoms such as methyl, ethyl, n-proply and isopropyl; lower alkoxy groups having 1 to 3 carbon atoms such as methoxy, ethoxy, n-propoxy and isopropoxy; hydroxyl group; amino group; and lower alkyl-substituted amino groups having 1 to 4 carbon atoms such as methyl amino group, dimethyl amino group, ethyl amino group and diethyl amino group. With respect to the inactive substituent group in the aromatic group of the N-substituted melamine compound, even if the number thereof is varied within the range of 0 to 3, it does not give any substantial influence on the effects of the N-substituted melamine compound, so that the number of the inactive substituent group may be suitably selected from the range of 0 to 3.

The Y in the aforementioned general formula (2) represents an alkyl group or an aromatic group. As is well known, when the alkyl group is typically constituted by methyl, it is turned out to be acetoguanamine, while when the aromatic group is typically constituted by aryl, it is turned out to be benzoguanamine. Various kinds of alkyl groups and of aromatic groups which are exemplified above in relative to the general formula (1) can be also employed in the same manner. By the way, a couple of amino groups may contain 1 to 4 substituent groups which are exemplified as substituent groups of the aforementioned $X^1$, $X^2$, $X^3$, $X^4$, $X^5$ and $X^6$.

According to the present invention, the N-substituted melamine compound and the guanamine compound, which are represented by the aforementioned general formulas (1) and (2), respectively, are employed as an organic acid salt, preferable examples of which include organic salts of carboxylic acid, phosphoric acid, sulfonic acid and anhydrides thereof. The organic acid groups after the reaction of these organic acids and anhydrides thereof are residual acid groups which can be obtained by removing hydrogen atom (H) from the organic acids shown in the aforementioned general formulas (3), (4) and (5).

The formula represented by the aforementioned general formula (3) may be called organic carboxylic acid, wherein $R^1$ is selected from hydrogen atom, an alkyl group, an alkenyl group and an aromatic group. As for the alkyl group and alkenyl group, it is possible to employ straight-chain or branched groups having 1 to 18 carbon atoms as well as cyclic aliphatic hydrocarbon groups. Any ways, the residual organic carboxylic acid group is formed of a residual monobasic acid group where carboxyl group is not substituted or of a residual polybasic acid group where at least one carboxyl group is substituted. In this case, although the residual group may contain a different kind of substituent group other than carboxyl group, the number of carboxyl group in $R^1$ may range from 0 to 3. As for the organic acid, it may be carboxylic acid selected from monobasic acid, dibasic acid, tribasic acid and tetrabasic acid or the anhydride thereof. As for the aforementioned different kind of substituent group other than carboxylic group, it is possible to employ a hydrophilic group such as hydroxyl group, etc. The carboxylic group may be combined with a metal or a base such as amines, thereby being formed into a salt. These features of organic acid will be also applicable to the acids to be described hereinafter. Therefore, the present invention also includes in its scope such modifications. Namely, according to the present invention, specific examples of the organic acid include lactic acid, phthalic acid, trimellitic acid and the compounds analogous to these acids. As for the anhydride of the organic acid, the anhydrides of the aforementioned organic acids can be employed. These organic acids and anhydrides may be employed singly or in combination of two or more kinds.

The formula represented by the aforementioned general formula (4) may be called organic phosphoric acid, wherein $R^2$ represents hydrogen atom, an alkyl group, an alkenyl group or an aromatic group. As for the alkyl group and alkenyl group, it is possible to employ straight-chain or branched groups having 1 to 9 carbon atoms as well as cyclic aliphatic hydrocarbon groups. Further, $R^3$ represents hydrogen atom, an alkyl group, an alkenyl group or an aromatic group. As for these alkyl group and alkenyl group, it is possible to employ straight-chain or branched groups having 1 to 9 carbon atoms. $R^2$ and $R^3$ may be substituted by acryloyl group and methacryloyl group, respectively. If both of $R^2$ and $R^3$ are constituted by hydrogen atom, the compound represented by the aforementioned general formula (4) would become phosphoric acid. The compound where $R^2$ and $R^3$ are substituted by acryloyl group and methacryloyl group, respectively, can be manufactured by making use of "Kayamer PM2" (trade name: Nippon Kayaku Co. Ltd.).

The formula represented by the aforementioned general formula (5) may be called organic sulfuric acid, which is an organic acid having a residual acid group that is obtained through the esterification of sulfuric acid. In this general formula (5), $R^4$ represents hydrogen atom, an alkyl group, an alkenyl group or an aromatic group. As for these alkyl group and alkenyl group, it is preferable to employ straight-chain or branched groups having 1 to 18 carbon atoms. If $R^4$ is constituted by hydrogen atom, the compound represented by the aforementioned general formula (5) would become sulfuric acid.

By the way, sulfuric acid may be called an inorganic acid, but can be deemed as being an extreme case of organic sulfuric compound, and hence, sulfuric acid is assumed as being an organic acid in the present invention. This theory can be applied likewise to other so-called inorganic acids.

The aforementioned item (B) the acid salts of N-substituted melamine compound and acid salts of guanamine compound, in particular, the organic salts of these compounds are designed to be employed as a curing promoter for the thermosetting compound constituting the component (E) to be hereinafter discussed, in particular, for an epoxy-based thermosetting compound, so that the reaction between the epoxy group of this epoxy-based thermosetting compound and the carboxyl group that has been introduced into the resin constituting the aforementioned component (A) would hardly take place at the ordinary temperature. However, when the reaction mixture is heated, the reaction would take place rapidly. Namely, these organic salts are provided with a function as a so-called latent type curing promoting agent. Therefore, as compared with even with the cases where an N-substituted melamine compound or a guanamine compound is employed, the photosensitive composition according to the present invention containing an appropriate quantity of this latent type curing promoting agent is excellent in pot life, and in storage stability, and hence, the coated film thereof is capable of widening the aforementioned thermal control tolerance.

The reason for this can be attributed to the facts that since an N-substituted melamine compound or a guanamine compound is formed into a salt through the reaction thereof with an organic acid, the compatibility thereof with the resin constituting the aforementioned component (A) or with the thermosetting compound can be lowered under the ordinary temperature as compared with these N-substituted melamine compound and guanamine compound are not formed into a salt, thereby minimizing the opportunity thereof for contacting with these resin and epoxy-based thermosetting compound, and suppressing the cure-promoting property of these N-substituted melamine compound and guanamine compound, and that since the basic strength of these N-substituted melamine compound and guanamine compound can be lowered due to the transformation thereof into a salt, the cure-promoting effect by the epoxy-based thermosetting compound can be inhibited in the reaction. Any way, as compared with the case where an N-substituted melamine compound or a guanamine compound is employed, as it is, as a cure promoter, the thermal latency (the property which makes it possible to suppress the cure-promoting property under the ordinary temperature and to exhibit the inherent cure-promoting property thereof under a heated condition) of these compounds can be enhanced. As a result, it is possible to further improve the pot life, storage stability, thermal control tolerance and heat resistance of the photosensitive resin composition. On the other hand, when the coated film is post-cured at a high temperature (for example, 140° C. or more) after the coated film is formed into a pattern, the acid salt of the N-substituted melamine compound or the guanamine compound can be decomposed to generate the N-substituted melamine compound or the guanamine compound, thereby enabling these compounds to exhibit their inherent cure-promoting property, thus enhancing the properties of the cured coated film such as heat resistance, adhesion, electric insulation and chemical resistances. In this case, since the mixing ratio of the aforementioned component (B) in the composition can be increased due to the enhancement of the thermal latency of the component (B), the aforementioned properties of the cured coated film such as heat resistance can be further improved.

The N-substituted melamine compound as well as the guanamine compound are inherently excellent in compatibility with the resin, etc. included in the photosensitive resin composition. Therefore, the N-substituted melamine compound or the guanamine compound which has been separated through the decomposition from an organic acid is excellent in affinity to the cured coated film of the photosensitive resin composition as compared with melamine or a guanamine compound. Accordingly, it is now possible to prevent the N-substituted melamine compound or the guanamine compound from being separated on the surface of the cured coated film, thereby preventing, even under a high humidity condition, free moisture from penetrating into the missing portion of these compounds that may be produced by the separation of these compounds. As a result, it is possible to prevent the deterioration of the electric insulation of the cured coated film and to prevent the deterioration in adhesion of the cured coated film to the copper foil of printed wiring board.

The acid salts, in particular organic acid salts of the N-substituted melamine compound or the guanamine compound constituting the component (B) may be employed singly or in combination of at least two kinds thereof. The mixing ratio of these compounds may be selected depending on the active hydrogen equivalent thereof, on the content of the epoxy-based thermosetting compound constituting the component (E), or on the epoxy equivalent. Generally, however, the mixing ratio of these compounds may be selected from the range of 0.1 to 5 g per 10 g of the component (A). If this mixing ratio of these compounds is less than 0.1 g per 100 g of the component (A), the thermosetting property of these compounds may not be sufficiently exhibited. On the other hand, if this mixing ratio of these compounds exceeds over 5 g per 100 g of the component (A), the pot life of the photosensitive resin composition of the present invention would be more likely shortened, thereby giving rise to the deterioration of the properties of the solder resist film formed of the photosensitive resin composition. When the thermosetting property of these compounds, the pot life of the photosensitive resin composition and the properties of solder resist film are taken into consideration, the mixing ratio of the aforementioned component (B) should preferably be selected from the range of 1 to 4 g.

According to the present invention, the photosensitive resin composition can be formed by mixing therein (C) a photopolymerization initiator, (D) a diluent, and (E) a thermosetting compound in addition to the aforementioned (A) and (B), this photosensitive resin composition is suited for use as a solder resist composition for manufacturing a printed wiring board for instance.

As for the aforementioned (C) a photopolymerization initiator, there is not any particular limitation and hence any known materials can be employed. Representative examples thereof include benzoin, benzoin methyl ether, benzoin ethyl ether, benzoin isopropyl ether, benzoin-n-butyl ether, benzoin isobutyl ether, acetophenone, dimethylamino acetophenone, 2,2-dimethoxy-2-phenyl acetophenone, 2,2-diethoxy-2-phenyl acetophenone, 2-hydroxy-2-methyl-1-phenylpropan-1-one, 1-hydroxycyclohexylphenyl ketone, 2-methyl-1-[4-(methylthio)phenyl]-2-morpholino-propan-1-one, 4-(2-hydroxyethoxy)phenyl-2-(hydroxyl-2-propyl) ketone, benzophenone, p-phenyl benzophenone, 4,4'-diethylamino benzophenone, dichloro benzophenone, 2-methylanthraquinone, 2-ethylanthraquinone, 2-tertiary butylanthraquinone, 2-aminoanthraquinone, 2-methylthioxanthone, 2-ethylthioxanthone, 2-chlorothioxanthone, 2,4-dimethylthioxanthone, 2,4-diethylthioxanthone, benzyldimethyl ketal, acetophenone dimethyl ketal, p-dimethylamino benzoic ethylester, etc. these compounds can be employed singly or in combination of two or more kinds thereof.

The mixing ratio of the photopolymerization initiator may be generally in the range of 0.2–30 g based on 100 g of the active energy ray-curable resin constituting the component (A). If the mixing ratio of the photopolymerization initiator is less than 0.2 g, it would become difficult to enable the active energy ray-curable resin to proceed the photo-curing reaction thereof. On the other hand, even if the mixing ratio of the photopolymerization initiator is increased exceeding over 30 g, it is impossible to further enhance the effects expected of the photopolymerization initiator, and hence an excessive addition of the photopolymerization initiator is economically disadvantageous. Furthermore, any excessive addition of the photopolymerization initiator may invite the deterioration of the mechanical properties of the cured film thereof. In viewpoints of the photo-curing properties, economy and mechanical properties of cured film, the mixing ratio of the photopolymerization initiator should preferably be in the range of 2.0–20 g based on 100 g of the active energy ray-curable resin.

The diluent (D) is constituted by at least one kind of materials selected from a photo-polymerizable monomer and an organic solvent. This photo-polymerizable monomer is also called a reactive diluent and is designed to be employed for promoting the photo-curing of the photosensitive resin constituting the component (A) and for obtaining a coated film which is excellent in acid resistance, heat resistance and alkali resistance. Preferably, the photopolymerizable monomer should be selected from compounds having at least two double bonds in each molecule. An organic solvent may be employed for the purpose of adjusting the viscosity and drying property of the photosensitive resin composition comprising a photosensitive resin constituting the aforementioned component (A). However, the organic solvent may not be employed if the employment thereof is not required. Further, if the photo-curability of the photosensitive resin constituting the aforementioned component (A) is sufficiently large in magnitude, the photo-polymerizable monomer may not be employed.

As for the specific examples of the photo-polymerizable monomer, it is possible to employ various kinds of reactive diluents such as 1,4-butanediol di(metha)acrylate, 1,6-hexanediol di(metha)acrylate, neopentylglycol di(metha) acrylate, polyethyleneglycol di(metha)acrylate, neopentylglycol diadipate di(metha)acrylate, hydroxyl pivalic acid neopentylglycol di(metha)acrylate, dicyclopentanyl di(metha)acrylate, caprolactone-modified dicyclopentenyl di(metha)acrylate, ethylene oxide-modified phosphoric acid di(metha)acrylate, allylcyclohexyl di(metha)acrylate, isocyanurate di(metha)acrylate, trimethylolpropane tri(metha) acrylate, dipentaerythritol tri(metha)acrylate, propionic acid-modified dipentaerythritol tri(metha)acrylate, pentaerythritol tri(metha) acrylate, propylene oxide-modified trimethylolpropane tri(metha)acrylate, tris(acryloxyethyl) isocyanurate, propionic acid-modified dipentaerythritol penta(metha)acrylate, dipentaerythritol hexa(metha) acrylate, caprolactone-modified dipentaerythritol hexa (metha)acrylate, etc.

The aforementioned 2 to 6-functional as well as other polyfunctional reactive diluents may be employed singly or in combination of two or more kinds. The mixing ratio of these reactive diluents may be selected generally from the range of 2.0 to 40 g per 100 g of the active energy ray-curable resin constituting the component (A). If the mixing ratio of these reactive diluents is less than 2.0 g, it would be impossible to achieve a sufficient photo-curing and to obtain satisfactory properties in terms of acid resistance and heat resistance of the cured film thereof. On the other hand, even if the mixing ratio of these reactive diluents is increased exceeding over 40 g, the cured film thereof would become excessively high in tackiness, thereby easily generating the adhesion of the cured film onto the substrate of art work film in the step of exposure, thus making it difficult to obtain a desirable cured film.

In view of various factors such as photo-curing property, the acid resistance and heat resistance of cured film, and the prevention of adhesion onto the substrate of art work film, the mixing ratio of the reactive diluent should more preferably be within the range of 4.0 to 20 g per 100 g of the active energy ray-curable resin.

As for the specific examples of the aforementioned organic solvent useful in this case, they include ketones such as methylethyl ketone, cyclohexanone, etc.; aromatic hydrocarbons such as toluene, xylene, etc.; alcohols such as methanol, isopropanol, cyclohexanol, etc.; alicyclic hydrocarbons such as cyclohexane, methylcyclohexane, etc.; petroleum solvents such as petroleum ether, petroleum naphtha, etc.; Cellosolves such as Cellosolve, butyl Cellosolve, etc.; carbitols such as carbitol, butyl carbitol, etc.; and acetic esters such as ethyl acetate, butyl acetate, Cellosolve acetate, butyl Cellosolve acetate, carbitol acetate, butylcarbitol acetate, etc. As for the catalyst to be employed in this case, it is possible to employ amines such as triethyl amine, tributyl amine, etc.; and phosphides such as triphenyl phosphine, triphenyl phosphate, etc.

The aforementioned thermosetting compound (E) in the photosensitive resin composition of the present invention is used for obtaining a sufficiently tenacious coated film after the post-curing thereof which is performed in subsequent to the steps of exposure and development of the coated film. Specific examples this thermosetting compound (E) include epoxy-based thermosetting compounds, and other kinds of thermosetting compounds. It is preferable that the photosensitive resin composition includes at least an epoxy-based thermosetting compound.

Typical and preferable examples of the epoxy-based thermosetting compounds include an epoxy resin (including epoxy oligomer) having at least one epoxy group, more preferably two or more epoxy groups per molecule thereof. For example, it is possible to employ bisphenol A type epoxy resin that can be obtained through the reaction between bisphenol A and epichlorohydrin in the presence of alkali; epoxides of a resin to be obtained through a condensation reaction between bisphenol A and formalin; resins corresponding to the aforementioned bisphenol A type epoxy resin or to the aforementioned epoxides, which can be obtained according to the same reaction as mentioned above except that brominated bisphenol A is substituted for bisphenol A; novolac type epoxy resin which can be obtained by the glycidyl-etherification of a novolac resin through a reaction thereof with epichlorohydrin (for example, phenol novolac type epoxy resin, o-cresol novolac type epoxy resin, p-tert-butyl phenol novolac type epoxy resin); bisphenol F type epoxy resin which can be obtained through a reaction between bisphenol F and epichlorohydrin; bisphenol S type epoxy resin which can be obtained through a reaction between bisphenol S and epichlorohydrin; alicyclic epoxy resins having cyclohexene oxide group, tricyclodecane oxide group, cyclopentene oxide group, etc.; glycidyl ester resins such as diglycidyl phthalatic ester, diglycidyl tetrahydrophthalatic ester, diglycidyl hexahydrophthalatic ester, diglycidyl-p-hydroxy benzoate, glycidyl dimeric ester, etc.; glycidyl amine-based resins such as tetraglycidyl aminophenyl methane, triglycidyl-p-aminophenol, etc.; glycidyl ether resins such as (propylene, polypropylene) glycol diglycidyl ether, polytetramethylene glycol diglycidyl ether, glycerol polyglycidyl ether, trimethylol propane polyglycidyl ether, resorcin diglycidyl ether, 1,6-hexane diol diglycidyl ether, (ethylene, propylene) glycol diglycidyl ether, sorbitol polyglycidyl ether, sorbitan polyglycidyl ether, pentaerythritol polyglycidyl ether, etc.; and triglycidyl isocyanurate having a triazine ring such as tris(2,3-epoxypropyl) isocyanurate, triglycidyl tris(2-hydroxyethyl) isocyanurate, etc. These thermosetting, compounds may be employed singly or in combination of two or more kinds thereof.

These thermosetting compounds may be employed together with a known epoxy curing promoting agent such as melamine compounds, imidazole compounds and phenol compounds in addition to the aforementioned component (B), thereby making it possible to further promote the post-curing of the coated film. When this thermal curing compound is co-used in this manner, it becomes possible to improve various properties such as heat resistance, moisture resistance, electric insulating property, chemical resistance, acid resistance, solvent resistance, adhesivity, flexibility and hardness, so that this thermal curing compound is suited for use as a solder resist for the manufacture of printed wiring boards.

The mixing ratio of the aforementioned epoxy thermosetting compounds when they are employed singly or in combination with other kinds of thermosetting compounds may be generally selected from the range of 5–100 g per 100 g of the active energy ray-curable resin constituting the component (A). If the mixing ratio of the thermosetting compounds is less than 5 g, it would be impossible to obtain satisfactory properties after the post-curing of the coated film. On the other hand, if the mixing ratio of the thermosetting compounds is increased exceeding over 100 g, the photocuring property of the component (A) may be deteriorated. In view of these facts, the mixing ratio of the thermosetting compounds should preferably be in the range of 15–60 g per 100 g of the active energy line-curable resin.

The photosensitive resin composition according to the present invention may further contain various kinds of additives as required in addition to the aforementioned components, specific examples of such additives including a filler consisting of inorganic pigment (s) such as silica, alumina, talc, calcium carbonate, barium sulfate, etc.; a known coloring pigment such as an organic pigment such as phthalocyanine green, phthalocyanine blue, etc. and an inorganic pigment such as titanium dioxide; an antifoaming agent; a leveling agent; etc.

The photosensitive resin composition according to the present invention which can be obtained as explained above can be coated to a desired thickness on the surface of a printed wiring board provided with a circuit pattern which can be formed by etching a copper foil of a copper-clad laminated board. The resultant coated film is then heated for 15–60 minutes at a temperature of 60–80° C. to evaporate the solvent, after which a negative film having a circuit pattern which is made light-transmissive except regions where soldering lands are located is adhered onto the coated film. Thereafter, the printed wiring board is irradiated with ultraviolet rays from over the negative film, and the unexposure portions corresponding to the soldering lands are removed by making use of a diluted aqueous alkaline solution to thereby develop the coated film. As for the diluted aqueous alkaline solution to be employed in this case, although 0.5–5 wt % aqueous solution of sodium carbonate is usually employed, it is also possible to employ other kinds of alkaline solution.

Then, the pattern of the coated film is subjected to post curing for 10–60 minutes by making use of a hot air circulate type dryer which is heated up to a temperature of 140–160° C. to thereby obtain an aimed solder resist film.

As a result, a printed wiring board having a solder resist film formed thereon can be obtained. Thereafter, electronic devices can be soldered and secured onto the surface of the printed wiring board by means of a jet flow soldering method or a reflow soldering method, thus accomplishing a single electronic circuit unit.

The present invention includes as a scope thereof not only a printed wiring board covered with a solder resist film before an electronic component is mounted thereon, but also a printed wiring board having an electronic component mounted thereon.

It should be noted that the present invention is intended to cover broader concepts with respect to each of the components and to the ratios thereof centering on those employed in the following Examples, so that the employment of analogous compounds to those described above at the aforementioned preferable ranges in ratio of these compounds is possible in the present invention. For example, it is possible to employ, as components for obtaining the resin constituting the aforementioned component (A), at least either one of acrylic acid and methacrylic acid as examples of the radically polymerizable unsaturated monocarboxylic acid, novolac type epoxy resin as an example of the multifunctional epoxy resin, and phthalic acid as an example of the polybasic acid.

As for the aforementioned component (B), one of the components thereof may be selected from N-substituted melamine compounds such as methylol melamine and butyl melamine; and guanamine compounds such as acetoguanamine and benzoguanamine, and the other components thereof may be selected from phthalic acid (as an organic acid), dialkyl phosphoric ester (alkyl group should be a lower alkyl), and a substituted or unsubstituted aromatic sulfonic acid such as toluene sulfonic acid. At least one of the components selected from each of these groups is combined with each other to produce an organic acid salt, one kind or two or more kinds of which are then employed.

As explained above, when this component (B) is employed, the N-substituted melamine compound or the guanamine compound is formed into a salt through the reaction thereof with an organic acid, the compatibility thereof with the resin constituting the aforementioned component (A) or with the thermosetting compound can be lowered under the ordinary temperature, thereby minimizing the opportunity thereof for contacting with these resin and epoxy-based thermosetting compound, and suppressing the cure-promoting property of these N-substituted melamine compound and guanamine compound. Moreover, since the basic strength of these N-substituted melamine compound and guanamine compound can be lowered due to the transformation thereof into a salt, the cure-promoting effect by the epoxy-based thermosetting compound can be inhibited in the reaction. Any way, as compared with the case where an N-substituted melamine compound or a guanamine compound is employed, as it is (i.e. without forming a salt), as a cure promoter, the thermal latency of these compounds can be enhanced. As a result, it is possible to further improve the pot life, storage stability, thermal control tolerance and heat resistance of the photosensitive resin composition.

On the other hand, since the organic acid salts of the N-substituted melamine compound or of the guanamine compound are decomposed at a temperature ranging from about 120 to 150° C., when the coated film is post-cured at a temperature 140° C. or more, the acid salt of the N-substituted melamine compound or the guanamine compound can be decomposed to generate the N-substituted melamine compound or the guanamine compound, thereby enabling these compounds to promote the thermal curing reaction to be effected by the epoxy-based thermosetting compound to be employed together with the aforementioned component (A), thus enhancing the properties of the cured coated film of the photosensitive resin composition such as heat resistance, electric insulation and chemical resistances. Further, due to the effects of two or more amino groups of each of these compounds, amides may be formed through the reaction thereof with the carboxyl group or acryloyl group of the resin constituting the aforementioned component (A) or Michael addition reaction may be caused to occur on one hand, and a chelate is caused to be formed through the reaction thereof with copper. As a result, the resin can be firmly bonded to the copper foil of the printed wiring board, thereby making it possible to explain the theory for the improvement of the adhesion of the resin to the copper foil. However, the present invention should not be construed as being restricted by this theory.

As explained above, in the cured coated film of the photosensitive resin composition, the affinity of the N-substituted melamine compound or the guanamine compound that has been separated from the organic acid is more excellent as compared with that of melamine or guanamine, so that these compounds can be prevented from being deposited on the surface of the cured coated film. Accordingly, it is now possible to prevent free moisture from penetrating into the deposited portion of these compounds even under a high humidity condition, to prevent the deterioration of the electric insulation of the cured coated film and to prevent the deterioration in adhesion of the cured coated film to the copper foil of printed wiring board.

EXAMPLES

Next, the present invention will be further explained with reference to the following examples, which are not intended to limit the present invention.

Synthesis Example 1

Acetoguanamine Phthalate 125 g of acetoguanamine, 148 g of phthalic anhydride and 5 L of water were placed into the a flask provided with a stirrer and a reflux tube, and were continuously refluxed for 5 hours to form a crystal, which was then filtered out and dried to obtain acetoguanamine phthalate.

Synthesis Example 2

Benzoguanamine Phthalate 187 g of benzoguanamine, 148 g of phthalic anhydride and 5 L of water were placed into the a flask provided with a stirrer and a reflux tube, and were continuously refluxed for 5 hours to form a crystal, which was then filtered out and dried to obtain benzoguanamine phthalate.

Synthesis Example 3

Hexamethylol Melamine Phthalate 306 g of hexamethylol melamine, 148 g of phthalic anhydride and 5 L of water were placed into the a flask provided with a stirrer and a reflux tube, and were continuously refluxed-for 5 hours to form a crystal, which was then filtered out and dried to obtain hexamethylol melamine phthalate.

Synthesis Example 4

Tributyl Melamine Phthalate 294 g of N-tributyl melamine, 148 g of phthalic anhydride and 5 L of water were placed into the a flask provided with a stirrer and a reflux tube, and were continuously refluxed for 5 hours to form a crystal, which was then filtered out and dried to obtain N-tributyl melamine phthalate.

Synthesis Example 5

Acetoguanamine Diethyl Phosphoric Ester 125 g of acetoguanamine, 154 g of diethyl phosphoric ester and 5 L of water were placed into the a flask provided with a stirrer and a reflux tube, and were continuously refluxed for 5 hours to form a crystal, which was then filtered out and dried to obtain acetoguanamine diethyl phosphoric ester.

Synthesis Example 6

Acetoguanamine Toluenesulfonate 125 g of acetoguanamine, 154 g of toluenesulfonic acid and 5 L of water were placed into the a flask provided with a stirrer and a reflux tube, and were continuously refluxed for 5 hours to form a crystal, which was then filtered out and dried to obtain acetoguanamine toluenesulfonate.

The crystalline substances obtained respectively from the aforementioned synthesis examples 1 to 6 were investigated with respect to the changes of the melting points thereof which was determined by means of thermal analysis (DSC) and with respect to the changes of absorption wavelength which was determined by means of infrared absorption analysis, finding that all of these substances were formed of a salt structure. It was further confirmed by way of the titration using potassium hydroxide (KOH) that each of these substances was formed of a salt with the molar ratio between the guanamine compound or the N-substituted melamine compound and the organic acid being 1:1.

Resin Manufacturing Example 1

Photosensitive Resin as the Aforementioned Component (A)

A cresol novolac type epoxy resin 200 in epoxy equivalent and having seven phenol residual groups in average per molecule and epoxy group was allowed to react with acrylic acid at a molar ratio of 1:1 in ethyl carbitol acetate to obtain a reaction product, which was then allowed to react with tetrahydrophthalic anhydride at a molar ratio of 1:0.6 to manufacture a solution of photosensitive resin. This solution of photosensitive resin was formed of a viscous liquid containing 50 parts by mass of ethyl carbitol acetate per 100 parts by mass of the resin component constituting a solid matter. The acid value of the resin moiety was 93 mgKOH/g.

Example 1

1 g of acetoguanamine phthalate obtained in the aforementioned synthesis example 1, 8 g of 2-methyl-1-[4-(methylthio)phenyl]-2-morpholino-1-propan-1-one, 8 g of trimethylolpropane triacrylate, 8 g of triglycidyl tris(2-hydroxyethyl)isocyanurate, 0.5 g of phthalocyanine green, and 8 g of talc were added to 100 g of the solution of photosensitive resin which was obtained in the above resin manufacturing example 1 to obtain a mixture, which was then mixed together and dispersed by making use of a three-roll mill to thereby prepare a solution of photosensitive resin composition.

Then, this photosensitive resin composition was investigated by way of the following testing methods with respects to the pot life thereof, and the heat control tolerance and coating properties of the coated film, the results being shown in Table 1.

Example 2

1 g of benzoguanamine phthalate obtained in the aforementioned synthesis example 2, 8 g of 2-methyl-1-[4-(methylthio)phenyl]-2-morpholino-1-propan-1-one, 8 g of trimethylolpropane triacrylate, 8 g of triglycidyl tris(2-hydroxyethyl)isocyanurate, 0.5 g of phthalocyanine green, and 8 g of talc were added to 100 g of the solution of photosensitive resin which was obtained in the above resin manufacturing example 1 to obtain a mixture, which was then mixed together and dispersed by making use of a three-roll mill to thereby prepare a solution of photosensitive resin composition.

Then, this photosensitive resin composition was investigated by way of the following testing methods with respects to the pot life thereof, and the heat control tolerance and coating properties of the coated film, the results being shown in Table 1.

Example 3

1 g of hexamethylol melamine phthalate obtained in the aforementioned synthesis example 3, 8 g of 2-methyl-1-[4-(methylthio)phenyl]-2-morpholino-1-propan-1-one, 8 g of trimethylolpropane triacrylate, 8 g of triglycidyl tris(2-hydroxyethyl)isocyanurate, 0.5 g of phthalocyanine green, and 8 g of talc were added to 100 g of the solution of photosensitive resin which was obtained in the above resin manufacturing example 1 to obtain a mixture, which was then mixed together and dispersed by making use of a three-roll mill to thereby prepare a solution of photosensitive resin composition.

Then, this photosensitive resin composition was investigated by way of the following testing methods with respects to the pot life thereof, and the heat control tolerance and coating properties of the coated film, the results being shown in Table 1.

Example 4

1 g of N-butyl melamine phthalate obtained in the aforementioned synthesis example 4, 8 g of 2-methyl-1-[4-(methylthio)phenyl]-2-morpholino-1-propan-1-one, 8 g of trimethylolpropane triacrylate, 8 g of triglycidyl tris(2-hydroxyethyl)isocyanurate, 0.5 g of phthalocyanine green, and 8 g of talc were added to 100 g of the solution of photosensitive resin which was obtained in the above resin manufacturing example 1 to obtain a mixture, which was then mixed together and dispersed by making use of a three-roll mill to thereby prepare a solution of photosensitive resin composition.

Then, this photosensitive resin composition was investigated by way of the following testing methods with respects to the pot life thereof, and the heat control tolerance and coating properties of the coated film, the results being shown in Table 1.

Example 5

1 g of acetoguanamine diethylphosphoric ester obtained in the aforementioned synthesis example 5, 8 g of 2-methyl-1-[4-(methylthio)phenyl]-2-morpholino-1-propan-1-one, 8 g of trimethylolpropane triacrylate, 8 g of triglycidyl tris(2-hydroxyethyl)isocyanurate, 0.5 g of phthalocyanine green, and 8 g of talc were added to long of the solution of photosensitive resin which was obtained in the above resin manufacturing example 1 to obtain a mixture, which was then mixed together and dispersed by making use of a three-roll mill to thereby prepare a solution of photosensitive resin composition.

Then, this photosensitive resin composition was investigated by way of the following testing methods with respects to the pot life thereof, and the heat control tolerance and coating properties of the coated film, the results being shown in Table 1.

Example 6

1 g of acetoguanamine toluene sulfonate obtained in the aforementioned synthesis example 6, 8 g of 2-methyl-1-[4-(methylthio)phenyl]-2-morpholino-1-propan-1-one, 8 g of trimethylolpropane triacrylate, 8 g of triglycidyl tris(2-hydroxyethyl)isocyanurate, 0.5 g of phthalocyanine green, and 8 g of talc were added to long of the solution of photosensitive resin which was obtained in the above resin manufacturing example 1 to obtain a mixture, which was then mixed together and dispersed by making use of a three-roll mill to thereby prepare a solution of photosensitive resin composition.

Then, this photosensitive resin composition was investigated by way of the following testing methods with respects to the pot life thereof, and the heat control tolerance and coating properties of the coated film, the results being shown in Table 1.

Comparative Example 1

1 g of melamine, 8 g of 2-methyl-1-[4-(methylthio)phenyl]-2-morpholino-1-propan-1-one, 8 g of trimethylolpropane triacrylate, 8 g of triglycidyl tris(2-hydroxyethyl)isocyanurate, 0.5 g of phthalocyanine green, and 8 g of talc were added to 100 g of the solution of photosensitive resin which was obtained in the above resin manufacturing example 1 to obtain a mixture, which was then mixed together and dispersed by making use of a three-roll mill to thereby prepare a solution of photosensitive resin composition.

Then, this photosensitive resin composition was investigated by way of the following testing methods with respects to the pot life thereof, and the heat control tolerance and coating properties of the coated film, the results being shown in Table 1.

Comparative Example 2

1 g of acetoguanamine, 8 g of 2-methyl-1-[4-(methylthio)phenyl]-2-morpholino-1-propan-1-one, 8 g of trimethylolpropane triacrylate, 8 g of triglycidyl tris(2-hydroxyethyl)isocyanurate, 0.5 g of phthalocyanine green, and 8 g of talc were added to long of the solution of photosensitive resin which was obtained in the above resin manufacturing example 1 to obtain a mixture, which was then mixed together and dispersed by making use of a three-roll mill to thereby prepare a solution of photosensitive resin composition.

Then, this photosensitive resin composition was investigated by way of the following testing methods with respects to the pot life thereof, and the heat control tolerance and coating properties of the coated film, the results being shown in Table 1.

Comparative Example 3

1 g of hexamethylol melamine, 8 g of 2-methyl-1-[4-(methylthio)phenyl]-2-morpholino-1-propan-1-one, 8 g of trimethylolpropane triacrylate, 8 g of triglycidyl tris(2-hydroxyethyl)isocyanurate, 0.5 g of phthalocyanine green, and 8 g of talc were added to 100 g of the solution of photosensitive resin which was obtained in the above resin manufacturing example 1 to obtain a mixture, which was then mixed together and dispersed by making use of a three-roll mill to thereby prepare a solution of photosensitive resin composition.

Then, this photosensitive resin composition was investigated by way of the following testing methods with respects to the pot life thereof, and the heat control tolerance and coating properties of the coated film, the results being shown in Table 1.

The pot life of this photosensitive resin composition, the sensitivity and anti-tackiness (dry to touch) of the coated film, the heat control tolerance, and the characteristics of the coated film (deposit-inhibiting property, gold plating resistance, adhesivity, pencil hardness, acid resistance, solvent resistance, soldering heat resistance and electric properties) were evaluated as follows.

(1) Pot Life:

The photosensitive resin composition of each of the above Examples 1–6 and Comparative Examples 1–3 was placed in a closed vessel and heated in a thermostat 50° C. in temperature. The viscosity of the photosensitive resin composition was measured at every 24 hours by making use of a rotational viscometer until the viscosity thereof became three times as high as the initial viscosity thereof, thus counting the days that required to reach such a high viscosity.

(2) Sensitivity:

A layer 35 µm in thickness (before drying) of the photosensitive resin composition of each of the above Examples 1–6 and Comparative Examples 1–3 was coated on a test plate by means of screen printing method to form a 21-step tablet and then dried to prepare a coated substrate. Thereafter, the layer of the photosensitive resin composition was subjected at first to an ultraviolet irradiation at an exposure dose of 200 mJ/cm$^2$ and then to a development process by making use of 1% aqueous solution of sodium carbonate and at a spray pressure of 0.2 MPa.s. The sensitivity of the photosensitive resin composition was evaluated based on the maximum number of steps where the coated film had been completely left remained. The larger the maximum number of steps is, the more excellent the photosensitivity of the photosensitive resin composition is.

(3) Anti-Tackiness (Dry to Touch):

A layer 35 µm in thickness (before drying) of the photosensitive resin composition of each of the above Examples 1–3 and Comparative Examples 1–3 was coated on a pre-surface-treated substrate (a copper-clad laminate plate) by means of screen printing method and then dried for 20 minutes at a temperature of 80° C. to prepare a coated substrate. Thereafter, a negative film was adhered onto the surface of the coated layer. After being subjected to an exposure process, the magnitude of adhesion of the coated layer to the negative film was investigated and evaluated as follows.

⊚: The adhesion or the trace of adhesion was not recognized at all.

○: The trace of adhesion was recognized on the surface of the coated layer.

Δ: There was recognized resistance in peeling the negative film.

X: There was recognized an adhered matter of the coated layer on the surface of the negative film.

(4) Heat Control Tolerance:

A layer 35 μm in thickness (before drying) of the photosensitive resin composition of each of the above Examples 1–6 and Comparative Examples 1–3 was coated on a pre-surface-treated substrate (a copper-clad laminate plate) by means of screen printing method to thereby manufacture a coated substrate, and then dried in such a manner that the time of preliminary drying at a temperature of 80° C. was prolonged at intervals of 10 minutes which was extended up to 150 minutes to prepare various coated substrates as test pieces. Thereafter, the layer of the photosensitive resin composition of each of these various coated substrates was subjected to a development process for 60 seconds by making use of 1% aqueous solution of sodium carbonate and at a spray pressure of 2.0 kg/cm². The heat control tolerance of the photosensitive resin composition was evaluated based on the longest time (minutes) of preliminary drying which enabled the coated film to be completely removed.

(5) Characteristics of Coated Film:

A layer 35 μm in thickness (before drying) of the photosensitive resin composition of each of the above Examples 1–6 and Comparative Examples 1–3 was coated on a pre-surface-treated substrate (a copper-clad laminate plate) by means of screen printing method to obtain various kinds of coated substrates, each of which was then dried for 20 minutes at a temperature of 80° C. Thereafter, a negative film was adhered onto the surface of each coated layer. After being subjected to an exposure process, each of the coated substrates was subjected to a development process by making use of 1 wt % aqueous solution of sodium carbonate to form a pattern. Then, each of the coated substrate was allowed to thermally cure for 60 minutes at a temperature of 150% to thereby prepare test pieces each having a cured film thereon. Then, the characteristics of coated films were evaluated as follows.

(a) Deposit-Inhibiting Property:

The test piece having a cured coated film thereon was left to stand for 5 hours under the conditions of 121° C., 100%RH (relative humidity), and 0.2 MPa s to visually examine the condition of the coated film which was evaluated as follows.

⊚: No change was recognized in the coated film.

○: The coated film was discolored.

Δ: There was recognized the generation of deposit on the surface of the coated film.

X: In addition to the generation of deposit on the surface of the coated film, there was also recognized the peeling of the coated film.

(b) Soldering Heat Resistance:

The test pieces each having the cured film formed thereon were evaluated according to the testing method set forth in JIS C 6481. Namely, each of the test pieces was immersed for 30 seconds in a solder tank maintained at a temperature of 260%. Then, a cycle of peeling test using a Cellophane (tradename) adhesive tape was repeated up to three times to evaluate the condition of the coated film by way of visual observation.

⊚: There was no change in the coated film even after three cycles of peeling test.

○: There was recognized slight changes in the coated film after three cycles of peeling test.

Δ: There was recognized changes in the coated film after two cycles of peeling test.

X: There was recognized the peeling of the coated film after one cycle of peeling test.

(c) Pencil Hardness:

The coated films were evaluated based on JIS K-5400 6.14.

(d) Acid Resistance:

The test pieces each having the cured film formed thereon were immersed for 30 minutes in 10 wt % aqueous solution of sulfuric acid at normal temperature. Then, after being water-washed, a peeling test using a Cellophane adhesive tape was performed to visually evaluate the acid resistance of the coated film through the observation of the peeling and discoloration of the coated film.

⊚: There was no change in the coated film.

○: There was recognized slight changes in the coated film.

Δ: There was recognized prominent changes in the coated film.

X: The coated film was swelled and peeled.

(e) Solvent Resistance:

The test pieces each having the cured film formed thereon were immersed for 30 minutes in methylene chloride at normal temperature. Then, after being water-washed, a peeling test using a Cellophane adhesive tape was performed to visually evaluate the solvent resistance of the coated film through the observation of the peeling and discoloration of the coated film.

⊚: There was no change in the coated film.

○: There was recognized slight changes in the coated film.

Δ: There was recognized prominent changes in the coated film.

X: The coated film was swelled and peeled.

(f) Gold-Plating Resistance:

The test pieces each having the cured film formed thereon were subjected to a gold-plating work. Then, a peeling test using a Cellophane adhesive tape was performed to visually evaluate the gold-plating resistance of the coated film through the observation of the peeling and discoloration of the coated film.

⊚: There was no change in the coated film.

○: There was recognized slight changes in the coated film.

Δ: There was recognized prominent changes in the coated film.

X: The coated film was swelled and peeled.

(g) Adhesivity:

The test piece having a cured coated film thereon was left to stand for 5 hours under the conditions of 121° C., 100%RH (relative humidity), and 0.2 MPa.s. Thereafter, the adhesivity of the test piece was measured by way of a cross-cut adhesion test based on JIS D-0202.

(h) Electric Properties (Insulation Resistance and Discoloration):

A tandem electrode B coupon of IPC SM-840B, B-25 was placed on the cured film of a test piece. Then, a DC voltage of 100V was applied to the cured film in a thermohygrostat which was maintained at a temperature of 60° C. and a relative humidity of 90% to thereby measure the insulation resistance (Ω) 500 hours later. At the same time, the discoloration of the coated film was observed to visually evaluate the degree of discoloration.

⊚: There was no change in the coated film.

○: There was recognized slight changes in the coated film.

Δ: There was recognized prominent changes in the coated film.

X: The coated film was swelled and peeled.

TABLE 1

|  | Example | | | | | | Comp. EX. | | |
| --- | --- | --- | --- | --- | --- | --- | --- | --- | --- |
|  | 1 | 2 | 3 | 4 | 5 | 6 | 1 | 2 | 3 |
| Pot life (days) | 4 | 4 | 3 | 4 | 3 | 5 | 2 | 1 | 1 |
| Sensitivity | 10 | 10 | 10 | 10 | 10 | 10 | 10 | 10 | 10 |
| Anti-tackiness | ○ | ○ | ○ | ○ | ○ | ○ | ○ | ○ | ○ |
| Heat control Tolerance (min) | 100 | 100 | 100 | 100 | 100 | 100 | 90 | 70 | 60 |
| Deposit-inhibiting property | ⊙ | ⊙ | ⊙ | ⊙ | ⊙ | ⊙ | Δ | ⊙ | ⊙ |
| Pencil Hardness | 6 H | 6 H | 6 H | 6 H | 6 H | 6 H | 6 H | 6 H | 6 H |
| Soldering heat Resistance | ○ | ○ | ○ | ○ | ○ | ○ | ○ | ○ | ○ |
| Acid resistance | ○ | ○ | ○ | ○ | ○ | ○ | ○ | ○ | ○ |
| Solvent resistance | ⊙ | ⊙ | ⊙ | ⊙ | ⊙ | ⊙ | ⊙ | ⊙ | ⊙ |
| Gold-plating Resistance | ○ | ○ | ○ | ○ | ○ | ○ | ○ | ○ | ○ |
| Adhesivity | 10 | 10 | 10 | 10 | 10 | 10 | 8 | 10 | 10 |
| Electric Properties |  |  |  |  |  |  |  |  |  |
| Insulation Resistance (Ω) | $3.0 \times 10^{12}$ | $2.0 \times 10^{12}$ | $3.0 \times 10^{12}$ | $2.0 \times 10^{12}$ | $3.0 \times 10^{12}$ | $1.0 \times 10^{12}$ | $2.0 \times 10^{12}$ | $3.0 \times 10^{12}$ | $3.0 \times 10^{12}$ |
| Discoloration | ○ | ○ | ○ | ○ | ○ | ○ | ○ | ○ | ○ |

It will be recognized from the results of Table 1 that in any of Examples 1 to 6, the photosensitive resin composition was found excellent in pot life, as well as in deposit-inhibiting property without giving any substantial changes to the coated film, and also excellent in heat control tolerance. Whereas, in the case of Comparative Example 1 wherein melamine was employed, the deposit-inhibiting property thereof was classified as being "Δ" indicating the generation of deposit on the surface of the coated film. Further, it will be recognized that, as compared with those of Examples 1 to 6, the photosensitive resin composition of Comparative Example 1 was as inferior in pot life as those of Comparative Examples 2 and 3 where acetoguanamine and hexamethylol melamine were employed, respectively. This can be attributed to the facts that while melamine, acetoguanamine and hexamethylol melamine were employed in these Comparative Examples, Examples 1 to 6 employed, instead of melamine, organic acid salts such as organic acid salts of acetoguanamine, organic acid salts of hexamethylol melamine, organic acid salts of other kinds of guanamine, and organic acid salts of organic acid salts of N-substituted melamine compound.

By the way, the aforementioned expression of "photosensitive resin composition" may be replaced by other expressions such as "photosensitive resin composition for solder resist", or "printed wiring board covered with a solder resist film, and the manufacturing method thereof". Further, the "photosensitive resin composition" may be limited by "heat control tolerance (i.e. the controllable range of thermal tolerance relative to the degree of curing of coated film that can be removed on the occasion of developing the unexposure regions at the step of drying the coated film (or the degree of curing which enables excellent developing properties such as resolution and accuracy))". Furthermore, the present invention may be further limited by the aforementioned various values and other limiting features or by the combinations thereof.

As explained above, according to the present invention, it is possible to provide a photosensitive resin composition which is capable of prolonging pot life, excellent in storage stability, capable of preventing deposits from being generated in a cured coated film, useful in forming an image by a process comprising a step of ultraviolet ray exposure and a step of development using a dilute aqueous alkaline solution, capable of widening the heat control tolerance, and capable of obtaining a pattern which is excellent in sensitivity, in heat resistance, in adhesion, in electric insulating properties and in chemical resistance. Especially, since the mixing ratio of the aforementioned component (B) in the composition can be increased due to the enhancement of the thermal latency of the component (B), the aforementioned properties of the cured coated film such as heat resistance can be further improved.

It is also possible according to the present invention to provide a printed wiring board with or without an electronic component being mounted thereon, the printed wiring board being provided with a cured solder resist film constituted by the aforementioned photosensitive resin compositions. Therefore, it is possible to provide a printed wiring board which is excellent in resolution, accuracy and characteristics of the cured coated film formed thereon.

What is claimed is:

1. A photosensitive resin composition comprising (A) an active energy ray-curable resin having at least two ethylenic unsaturated linkages per molecule thereof, (B) at least one kind material selected from acid salts of N-substituted melamine compound and acid salts of guanamine compound, (C) a photopolymerization initiator, (D) a diluent, and (E) a thermosetting compound.

2. The photosensitive resin composition according to claim 1, wherein said acid salts of N-substituted melamine compound are organic acid salts of N-substituted melamine compound represented by the following general formula (1) and said acid salts of guanamine compound are organic acid salts of guanamine compound represented by the following general formula (2)

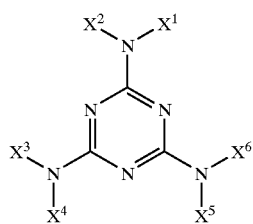

Formula (1)

wherein $X^1$, $X^2$, $X^3$, $X^4$, $X^5$ and $X^6$ may be the same or different and are individually hydrogen atom, an alkyl group (including a substituted alkyl group) or an aromatic group (including a substituted aromatic group) with the proviso that all of Xs are not hydrogen atom

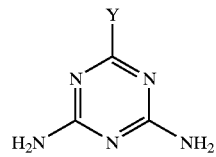

Formula (2)

wherein Y is an alkyl group or an aromatic group (including a substituted aromatic group).

3. The photosensitive resin composition according to claim 2, wherein said organic acid is at least one kind of compounds represented by the following general formulas (3), (4) and (5):

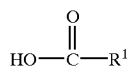

Formula (3)

wherein $R^1$ is hydrogen atom, an alkyl group, an alkenyl group or an aromatic group:

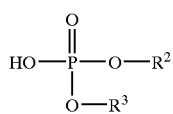

Formula (4)

wherein $R^2$ and $R^3$ may be the same of different and are individually hydrogen atom, an alkyl group, an alkenyl group or an aromatic group:

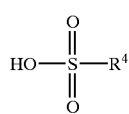

Formula (5)

wherein $R^4$ is hydrogen atom, an alkyl group, an alkenyl group or an aromatic group.

4. The photosensitive resin composition according to claim 1, wherein the mixing ratio of said at least one kind material selected from acid salts of N-substituted melamine compound and acid salts of guanamine compound (B) is 0.1 to 5 g per 100 g of said active energy ray-curable resin having at least two ethylenic unsaturated linkages per molecule thereof (A).

5. The photosensitive resin composition according to claim 2, wherein the mixing ratio of said at least one kind material selected from acid salts of N-substituted melamine compound and acid salts of guanamine compound (B) is 0.1 to 5 g per 100 g of said active energy ray-curable resin having at least two ethylenic unsaturated linkages per molecule thereof (A).

6. The photosensitive resin composition according to claim 3, wherein the mixing ratio of said at least one kind material selected from acid salts of N-substituted melamine compound and acid salts of guanamine compound (B) is 0.1 to 5 g per 100 g of said active energy ray-curable resin having at least two ethylenic unsaturated linkages per molecule thereof (A).

7. The photosensitive resin composition according to claim 1, wherein the mixing ratio of said photopolymerization initiator (C) is 0.2 to 30 g per 100 g of said active energy ray-curable resin having at least two ethylenic unsaturated linkages per molecule thereof (A).

8. The photosensitive resin composition according to claim 2, wherein the mixing ratio of said photopolymerization initiator (C) is 0.2 to 30 g per 100 g of said active energy ray-curable resin having at least two ethylenic unsaturated linkages per molecule thereof (A).

9. The photosensitive resin composition according to claim 1, wherein said diluent (D) is at least one kind of material selected from photopolymerizable monomer and an organic solvent, which is employed at a ratio of 2 to 40 g based on 100 g of said active energy ray-curable resin having at least two ethylenic unsaturated linkages per molecule thereof (A).

10. The photosensitive resin composition according to claim 2, wherein said diluent (D) is at least one kind of material selected from photopolymerizable monomer and an organic solvent, which is employed at a ratio of 2 to 40 g based on 100 g of said active energy ray-curable resin having at least two ethylenic unsaturated linkages per molecule thereof (A).

11. The photosensitive resin composition according to claim 1, wherein said thermosetting compound (E) is constituted by an epoxy compound with or without other kind(s) of thermosetting compound(s) and is employed at a ratio of 5 to 100 g based on 100 g of said active energy ray-curable resin having at least two ethylenic unsaturated linkages per molecule thereof (A).

12. The photosensitive resin composition according to claim 2, wherein said thermosetting compound (E) is constituted by an epoxy compound with or without other kind(s) of thermosetting compound(s) and is employed at a ratio of 5 to 100 g based on 100 g of said active energy ray-curable resin having at least two ethylenic unsaturated linkages per molecule thereof (A).

13. The photosensitive resin composition according to claim 3, wherein said thermosetting compound (E) is constituted by an epoxy compound with or without other kind(s) of thermosetting compound(s) and is employed at a ratio of 5 to 100 g based on 100 g of said active energy ray-curable resin having at least two ethylenic unsaturated linkages per molecule thereof (A).

14. The photosensitive resin composition according to claim 4, wherein said thermosetting compound (E) is constituted by an epoxy compound with or without other kind(s) of thermosetting compound(s) and is employed at a ratio of 5 to 100 g based on 100 g of said active energy ray-curable resin having at least two ethylenic unsaturated linkages per molecule thereof (A).

15. The photosensitive resin composition according to claim 5, wherein said thermosetting compound (E) is constituted by an epoxy compound with or without other kind(s)

of thermosetting compound(s) and is employed at a ratio of 5 to 100 g based on 100 g of said active energy ray-curable resin having at least two ethylenic unsaturated linkages per molecule thereof (A).

16. The photosensitive resin composition according to claim 6, wherein said thermosetting compound (E) is constituted by an epoxy compound with or without other kind(s) of thermosetting compound(s) and is employed at a ratio of 5 to 100 g based on 100 g of said active energy ray-curable resin having at least two ethylenic unsaturated linkages per molecule thereof (A).

17. A printed wiring board with or without an electronic component being mounted thereon, the printed wiring board being covered with a solder resist film constituted by a cured film of the aforementioned photosensitive resin composition as set forth in claim 1.

18. A printed wiring board with or without an electronic component being mounted thereon, the printed wiring board being covered with a solder resist film constituted by a cured film of the aforementioned photosensitive resin composition as set forth in claim 2.

19. A printed wiring board, with or without an electronic component being mounted thereon, the printed wiring board being covered with a solder resist film constituted by a cured film of the aforementioned photosensitive resin composition as set forth in claim 3.

20. A printed wiring board with or without an electronic component being mounted thereon, the printed wiring board being covered with a solder resist film constituted by a cured film of the aforementioned photosensitive resin composition as set forth in claim 4.

21. A printed wiring board with or without an electronic component being mounted thereon, the printed wiring board being covered with a solder resist film constituted by a cured film of the aforementioned photosensitive resin composition as set forth in claim 5.

22. A printed wiring board with or without an electronic component being mounted thereon, the printed wiring board being covered with a solder resist film constituted by a cured film of the aforementioned photosensitive resin composition as set forth in claim 6.

* * * * *